(12) United States Patent
Thibado et al.

(10) Patent No.: US 6,551,405 B1
(45) Date of Patent: Apr. 22, 2003

(54) TOOL AND METHOD FOR IN SITU VAPOR PHASE DEPOSITION SOURCE MATERIAL RELOADING AND MAINTENANCE

(75) Inventors: Paul M. Thibado, Fayetteville, AR (US); Vincent P. LaBella, Fayetteville, AR (US); Daniel W. Bullock, Fayetteville, AR (US)

(73) Assignee: The Board of Trustees of the University of Arkansas, Little Rock, AR (US)

( * ) Notice: Subject to any disclaimer, the term of this patent is extended or adjusted under 35 U.S.C. 154(b) by 0 days.

(21) Appl. No.: 09/668,899

(22) Filed: Sep. 22, 2000

(51) Int. Cl.[7] ............................................. C23C 16/00
(52) U.S. Cl. ........................ 118/726; 414/217; 414/939
(58) Field of Search ................................. 118/726, 727; 414/198, 178, 186, 207, 199, 217, 939, 160; 117/206, 224, 33, 35, 912, 108

(56) References Cited

U.S. PATENT DOCUMENTS

| | | | |
|---|---|---|---|
| 3,625,378 A | * 12/1971 | Attiz | 214/1 CM |
| 4,605,469 A | 8/1986 | Shih et al. | |
| 4,681,773 A | 7/1987 | Bean | |
| 4,687,400 A | 8/1987 | Lichti | |
| 4,850,779 A | * 7/1989 | Cashell et al. | 414/3 |
| 4,855,255 A | 8/1989 | Goodhue | |
| 4,966,519 A | 10/1990 | Davis et al. | |
| 4,984,952 A | * 1/1991 | Reuter | 414/180 |
| 4,999,316 A | 3/1991 | Goodhue et al. | |
| 5,044,871 A | 9/1991 | Davis et al. | |
| 5,080,870 A | 1/1992 | Streetman et al. | |
| 5,156,815 A | 10/1992 | Streetman et al. | |
| 5,431,735 A | 7/1995 | Briones | |
| 5,440,575 A | 8/1995 | Chand et al. | |
| 5,482,892 A | 1/1996 | Briones | |
| 5,932,294 A | * 8/1999 | Colombo et al. | 427/469 |
| 6,089,846 A | * 7/2000 | Collot et al. | 425/98 |

FOREIGN PATENT DOCUMENTS

| | | | |
|---|---|---|---|
| JP | 61-122192 A | 6/1986 | |
| JP | 9-7947 A | 1/1987 | |
| JP | 04-037689 | * 2/1992 | C30B/23/08 |

OTHER PUBLICATIONS

Izumi et al., "Multiwafer Gas Source Molecular Beam Epitaxial System for Production Technology," J. Vac. Sci. Technol., American Vacuum Society (May 1999), vol. 17 (No. 3), p. 1011–1016.*

Sonoda et al., Ultra–High Throughput of GaAs and (AlGa)As Layers Grown by Molecular Beam Epitaxy (MBE) with a Specially Designed MBE System, (publication unknown), accepted for publication 1987.

* cited by examiner

Primary Examiner—Gregory Mills
Assistant Examiner—Karla Moore
(74) Attorney, Agent, or Firm—J. Charles Dougherty

(57) ABSTRACT

A tool and method for reloading source materials in a vapor phase deposition (VPD) environment is disclosed. The tool and method does not require the venting of the VPD environment in order to perform its functions. The tool may reload source material into effusion cells or electron beam cells of a molecular beam epitaxy (MBE) machine without venting the growth chamber.

19 Claims, 4 Drawing Sheets

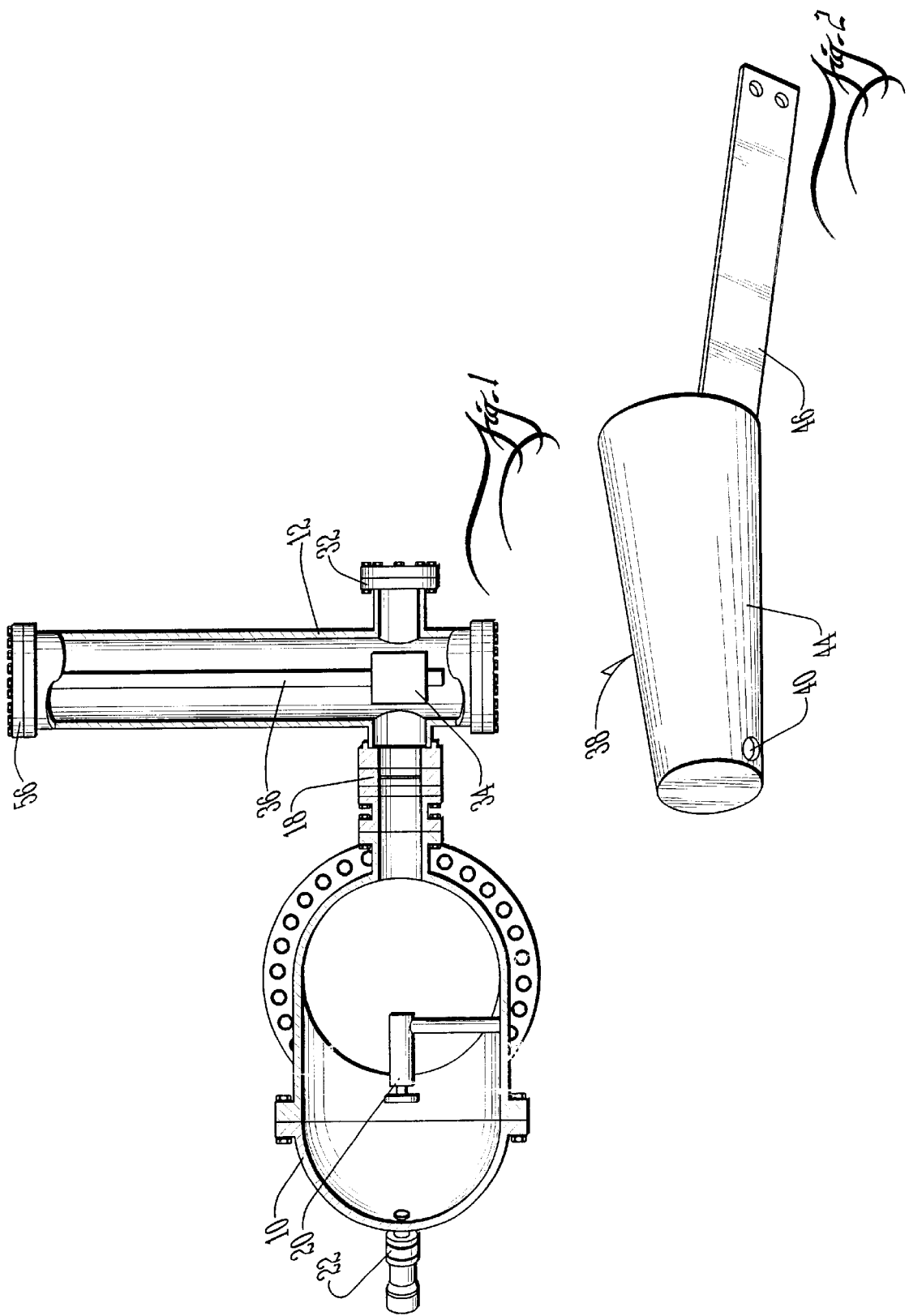

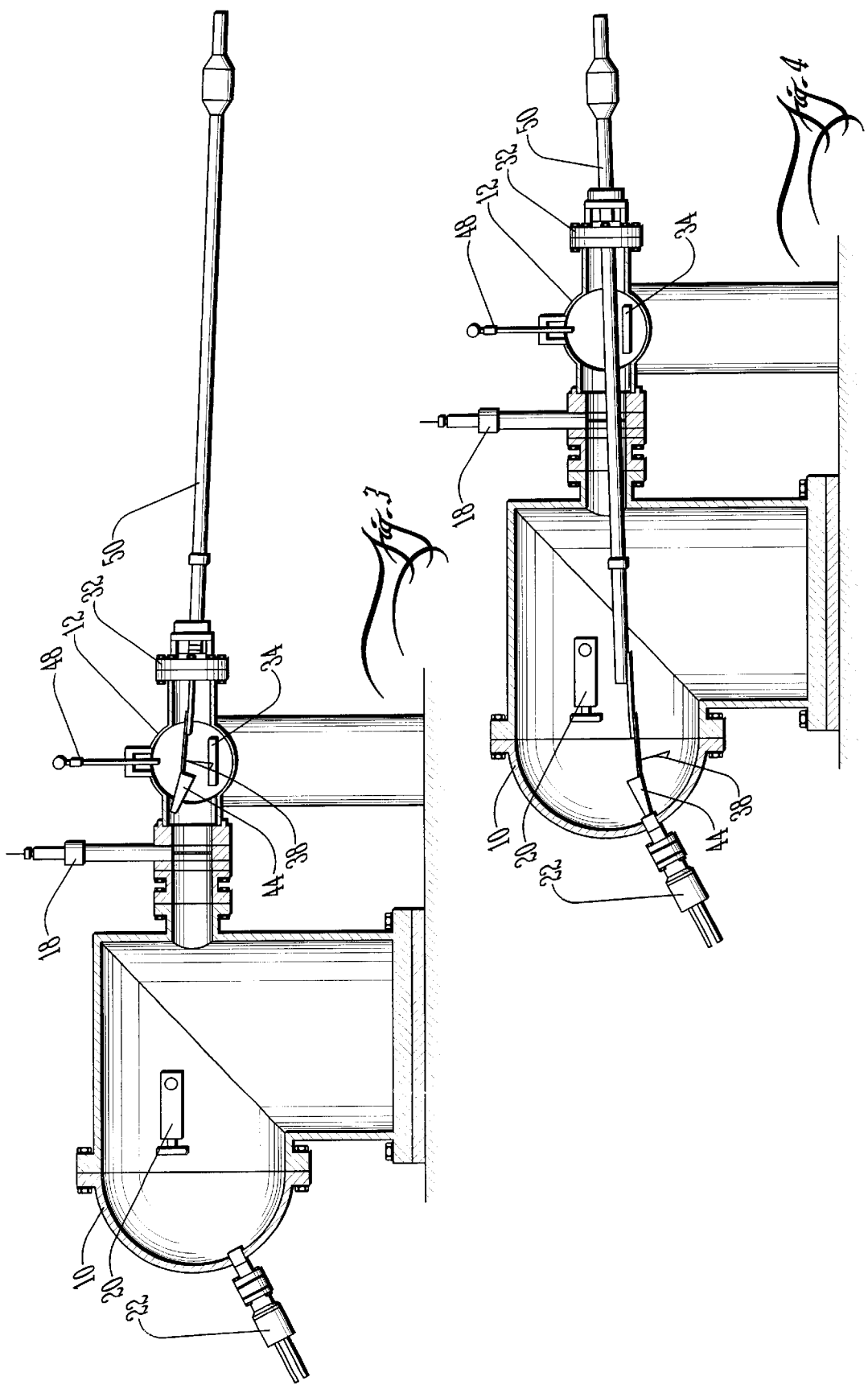

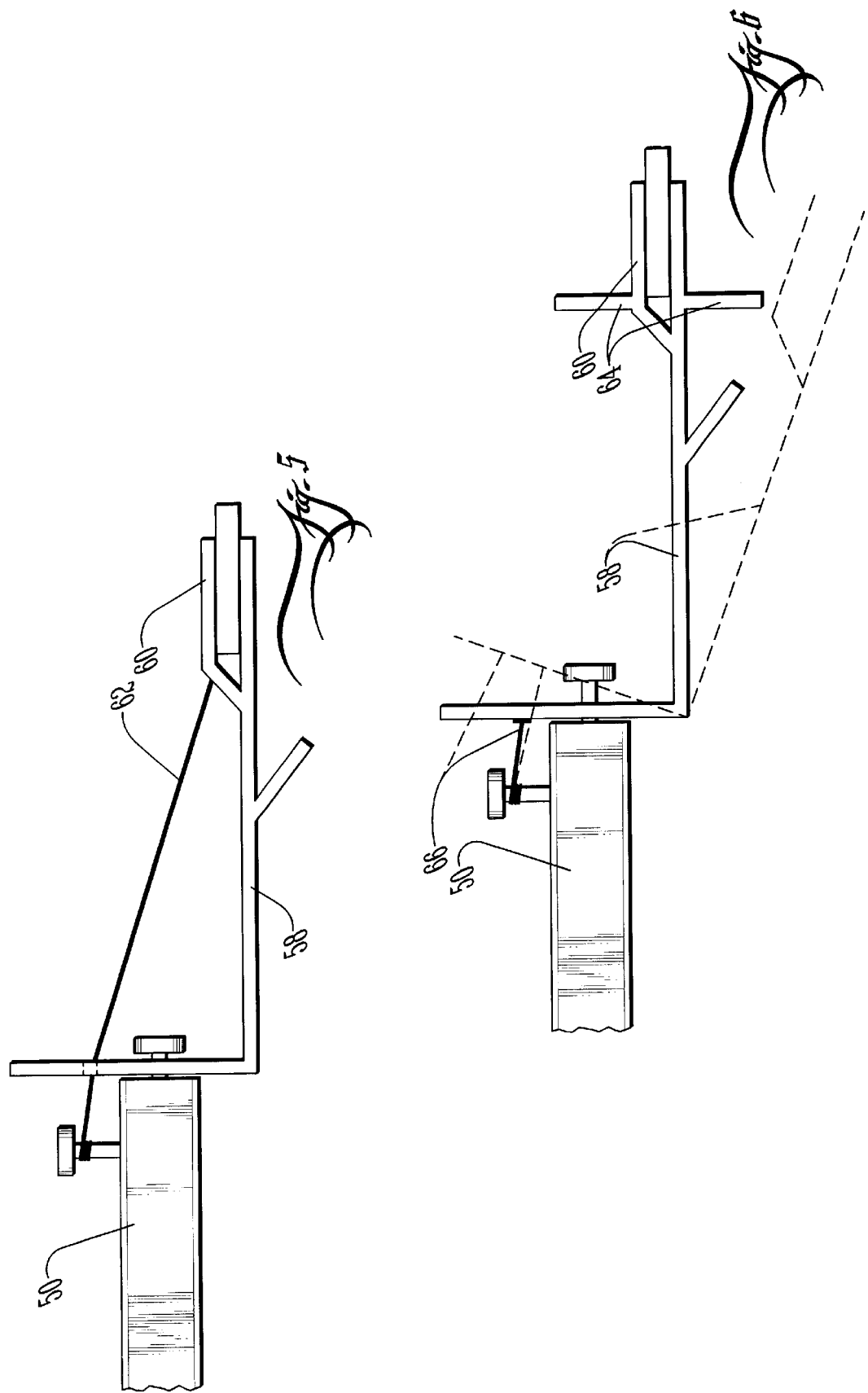

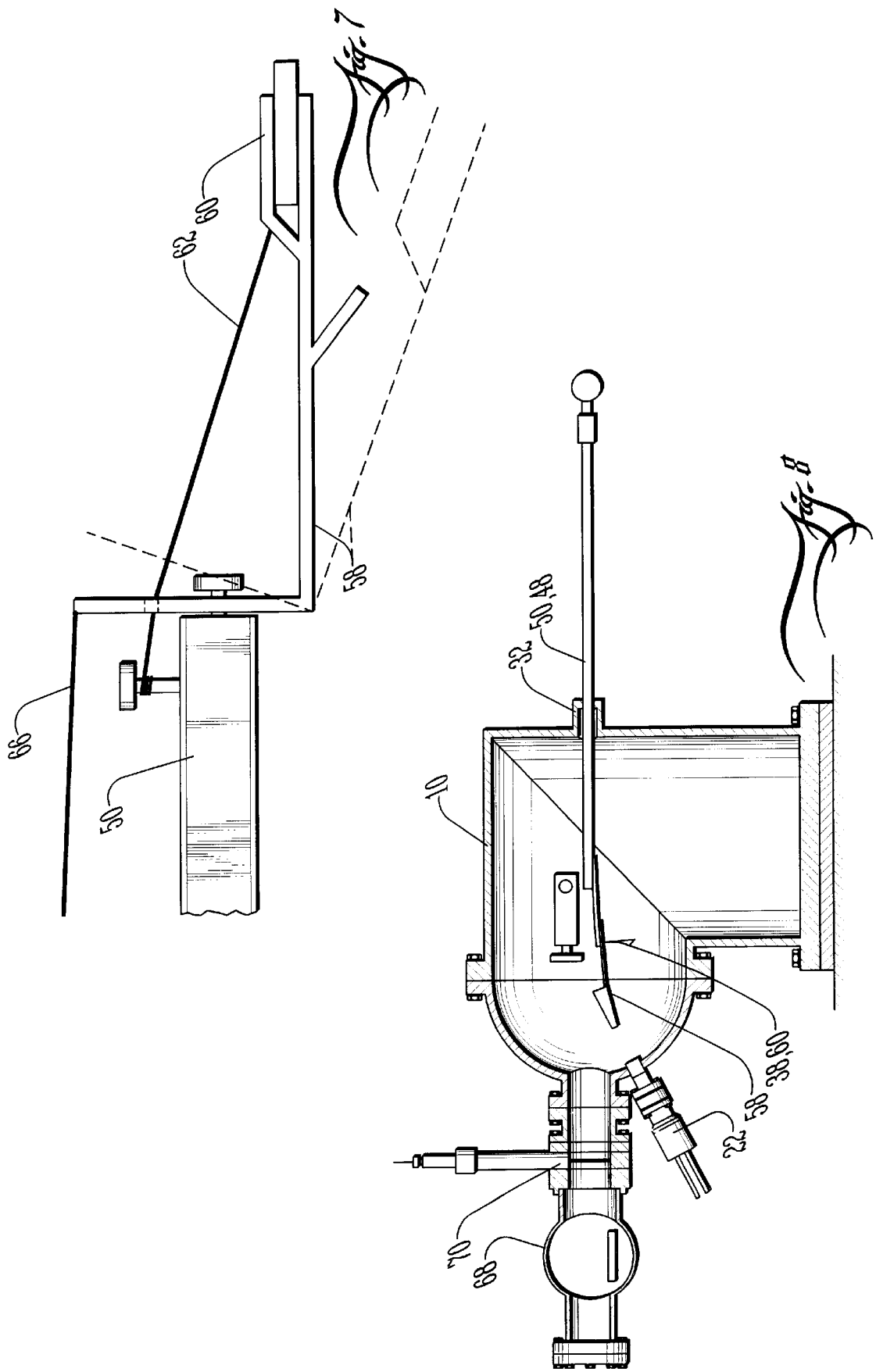

TOOL AND METHOD FOR IN SITU VAPOR PHASE DEPOSITION SOURCE MATERIAL RELOADING AND MAINTENANCE

BACKGROUND OF THE INVENTION

The invention is in the field of tools and methods for use in connection with maintained environments found in vapor phase deposition (VPD) processes, such as but not limited to vacuum environments maintained in molecular beam epitaxy (MBE) machines. In particular, the invention is directed to tools and methods for reloading source materials and performing maintenance in VPD environments, such as maintained in an MBE machine, without the necessity of breaking the vacuum of the environment to perform the reload or maintenance operation.

MBE is a technology that was developed in the early 1970's for the purpose of growing high-purity crystals, particularly epitaxial layers of compound semiconductors. Numerous types of crystal materials may be grown in MBE machines, but the most widely-used application today is III–V compound semiconductors (so called because the two elements used in forming the semiconductor are found in Groups IIIB and VB, respectively, of the periodic table of elements). Gallium Arsenide (GaAs) and other III–V compound semiconductor materials are widely used in optoelectronic components found in cellular telephones, lasers, microwave equipment, and other electro-optical applications.

In the MBE process, the elements that the semiconductors are made from are deposited onto a heated crystalline substrate wafer in the form of "molecular beams" to form thin epitaxial layers. The molecular beams are formed from thermally evaporated elemental sources. To obtain the necessarily high purity in the epitaxial layers, the material sources must be extremely pure and the entire crystalline growth process must take place in an ultra-high vacuum environment. Also, in order to finely control the deposition of material, the flow of the molecular beams must be precisely controlled. This is generally accomplished using shutters that can open and close in a fraction of a second. Fast shuttering and slow effluence rates makes possible the transition of one material to another at levels which only partially complete an atomic layer. The abrupt epitaxial transitions which can thus be achieved with MBE can be alternated to achieve superlattice structures, wherein some anomalous and highly desirable electrical, optical and magnetic properties may appear.

Most commercial and research MBE machines include at least two major components: a growth chamber and a load chamber. The load chamber is used to bring substrate wafers into and out of the machine while maintaining the vacuum integrity of the growth chambers. The load chamber is also used for the preparation, manipulation, and storage of substrate wafers. The growth chamber is where the MBE process is performed upon the substrate wafers. Effusion cells containing source materials are generally attached to and extend outward from the growth chamber. For certain source materials with very high melting points, electron beam cells may replace effusion cells.

One of the initial problems that was overcome in the design of MBE machines is the transport, storage, and manipulation of substrate wafers. A considerable length of time is required to purify and reestablish a vacuum within the growth chamber once the chamber is opened to the ambient atmosphere. Far less time is required to reestablish a vacuum in the load chamber section once it is opened, provided that the growth chamber remains closed. This is achieved by the use of an air lock between the growth chamber and load chamber. MBE machines have thus been designed so that wafers can be loaded and unloaded without the loss of vacuum in the growth chamber. Wafers are first loaded into the load chamber with the air lock between the load chamber and growth chamber closed. Once the load chamber again reaches a vacuum state, the air lock is opened so that wafers can be moved into the growth chamber. A transport system may be used to move the wafer or wafers through the load chamber. One example of such a system is a chain-driven cart that travels the length of the load chamber. Once the cart reaches the end of the load chamber nearest the growth chamber entrance, a magnetically coupled transfer arm can be used to carry the wafer or wafers lying in the cart from the load chamber into the growth chamber. The arm may be magnetically manipulated by a user situated near the MBE machine. Generally, the arm travels just into the load chamber when retracted, but may be extended into the growth chamber when pushed inward.

The load chamber may also include a vertically oriented manipulation arm, commonly referred to as a "wobble stick," which is generally used to move wafers to and from the load chamber transport means and the magnetically coupled arm. Once the wobble stick has transferred the wafer from the transport means to the magnetically coupled arm, the air lock between the load chamber and growth chamber is opened, and the magnetically coupled arm is extended into the growth chamber to load the wafer into the wafer holder.

The wafer holder in the growth chamber must be heated to maintain the proper temperature at the crystalline substrate wafer. The exact temperature required will depend upon the materials being used. In some systems the wafers are loaded into the growth chamber in an orientation that faces away from the material sources initially, so the wafer holder must flip around to face the wafer toward the material sources before material deposition may begin. The substrate wafer holder and other components that are to be heated must be made of materials that do not decompose or outgas impurities even when heated to high temperatures; such materials as Tantalum (Ta), Molybdenum (Mo), and pyrolytic boron nitride (PBN) have been used for these applications.

MBE machines may be either solid-source or gas-source. Gas-source machines have the advantage of easier reloading of the source material, since all that is required is the replacement of a pressurized bottle holding the gas source material. For a variety of reasons, including output quality and suitability, for some applications solid-source machines are preferred over gas-source machines. There are, therefore, certain MBE applications for which only solid-source materials are used. The solid source material is sublimated within the effusion cell by applying heat. The flux travels out of the effusion cell into the growth chamber as the shutter to the effusion cell opens. In gas-source MBE machines, the sublimation step is of course unnecessary, since a pressure regulator forces the flow of material which is already in the gaseous state to the substrate.

In solid-source MBE machines, the material sources are generally held in PBN crucibles contained within the effusion cells. Each effusion cell may be heated independently to reach the desired flux of the particular material located in that cell. Small changes in flux can significantly affect the epitaxial layer deposition process for some materials, and thus highly accurate thermostats must be used on the effusion cell heaters. Also, the control shutters that open and close the flow of flux from the effusion cells may be computer controlled to allow the cells to be opened and closed quickly and precisely. It should be noted that most MBE machines may accommodate a number of different effusion cells attached to the growth chamber housing, such that numerous types of source materials may be evaporated simultaneously. Since the properties of each material differ, the specific design of each effusion cell must be different in order to properly handle the particular material in question.

Generally, commercial effusion cells may only be heated to a temperature of approximately 1300° C. before the PBN crucibles begin to disintegrate. For this reason, some materials cannot be placed in effusion cells because the temperature required to vaporize such materials is too great. Iron (Fe) is an example of one such material. When such materials are to be used, electron beam cells replace the effusion cells. Electron beam cells vaporize source material by exposing the source material to highly energized electrons. In one configuration, a rod of the source material is placed parallel to a filament. A large current is then run through the filament until, due to the filament's high resistivity, it is heated to a very high temperature. A potential difference is then applied between the filament and rod such that electrons are drawn from the filament toward the rod. These highly energized electrons then strike the surface of the source material, causing it to vaporize.

One of the most significant problems still faced by those using solid-source MBE machines is the long delay caused by the reloading of source materials into the effusion cells and electron beam cells. Typically, the growth chamber of the MBE machine must be "vented" (brought up to atmospheric pressure and opened) in order for the cells to be reloaded. Once the source material is used up, the machine is then opened, and each cell is removed so that it may be carefully reloaded by hand. In the case of effusion cells, the delicate PBN crucible within the cell must be refilled with source material. The growth chamber must again be brought to ultra-high vacuum and the environment purified in order to proceed with the MBE process after reloading of source material. Because of the extreme levels of purity and vacuum necessary for the operation of MBE machines, this process requires a substantial amount of time. It is believed that an approximate average for most solid-source commercial production MBE machines building GaAs crystals is a source material reloading downtime of approximately one month for each three months of operation. The cost of this reloading downtime includes not only the cost of labor and materials to perform the repurification of the growth chamber, but also the opportunity cost of missing one month of production, or the cost of purchasing a duplicate machine to continue producing materials while the other machine is undergoing the repurification procedure.

Several solutions to the source material reloading problem have been suggested in the prior art. One solution is to use gaseous source materials rather than solid materials. As already explained, gaseous source materials are not used for some applications. Another partial solution is to simply increase the size of the effusion cell so that it may hold a larger source sample. The principal MBE machine manufacturers have continued to increase sample size with each new generation of MBE machine, but it is believed that the ability to continue increasing sample size has approached its practical limit. For some materials, such as Ga, the size of the sample will affect the ability to maintain accurate temperature control, and thus will effect the quality of the molecular beam. As a result of this problem, the sample size cannot be increased indefinitely without affecting the operation of the machine. Also, as sample sizes increase, powered equipment is necessary to move and load the samples, greatly increasing the cost and complexity of MBE machines.

Another solution that has been attempted is to reload the cells from the back (that is, the end extending outward from the growth chamber) without venting the growth chamber. If an air lock and means to translate the cell is placed between the effusion cell and the chamber, such that the cell can be backed away and sealed from the growth chamber, then the cell can be opened and the material can be placed into the effusion cell by hand without losing the vacuum on the growth chamber. This approach does, however, have several disadvantages. First, since each cell contains a different type of material, the hardware necessary to perform reloading of each cell would necessarily be specialized to that particular cell. A machine with twelve different effusion cells, for example, may require twelve different hardware systems to perform this "back loading" operation, which would greatly increase the cost, complexity, and reliability of the machine and reloading procedure. Second, this approach would require that the cell be removed each time the material is reloaded. As a result of exposing the entire cell to the atmosphere, a lengthy purification process is still required before normal operation of the MBE machine can resume. Finally, this approach would only allow access to the cell during the source material reloading process, and would not allow simultaneous maintenance and cleaning of the growth chamber, or any other maintenance operations on the front side of the air lock separating the cell from the growth chamber. Therefore, a means to reload source material in maintained environments, including the ultra-high vacuum environments of solid-source MBE machines, where the growth chamber need not be vented and cleaning and maintenance within the growth chamber may be performed, is desired.

SUMMARY OF THE INVENTION

The invention comprises an apparatus and method to perform activities in a vapor phase deposition environment, like a vacuum environment found in a solid-source MBE machine, by the use of a tool inserted through a port on the load chamber and extending into the growth chamber; or attached directly to the growth chamber. Such tools can thus be used to reload every effusion or electron beam cell in an MBE machine. The tools are constructed of a material, such as Tantalum or Molybdenum, that can withstand the temperatures typically encountered in MBE machines without outgassing impurities.

One of the tools may include a solid source material reloader for easily melted materials. This tool may preferably be formed in the shape of a tube or cone with a small hole in the bottom. The tube is designed to receive solid source material. The handle of the tool is attached to a magnetically coupled transfer arm, similar to those employed in MBE machines to move substrate wafers into and out of the growth chamber. The handle may also be attached to a magnetically coupled transfer arm designed particularly for this purpose, which replaces the standard magnetically coupled arm used for substrate wafer loading. By manipulating the magnetically coupled arm, the tool can be moved such that the tube enters the desired effusion cell. The heater located within the effusion cell may then be used to heat the tube such that the surface material within the tube melts, and runs through the small hole in the base of the tube into the crucible located within the effusion cell. If necessary, an additional heater can be added to the tool to provide more heat to melt the source material.

For reloading solid source materials that are not easily melted, an "on-axis" embodiment of the invention features an L-shaped support attached to either a handle or the magnetically coupled arm. The support has a compression clamp at its end which holds the solid source material in place. A wire is connected at one end to one side of the compression clamp, and at its other end to the magnetically coupled arm. Once the source material is in position relative to the cell for placement, the magnetically coupled arm may be turned about its axis, such that the wire pulls one side of the compression clamp, thereby opening the clamp and releasing the source material into the cell.

In another embodiment of the invention used for reloading solid source materials that are not easily melted, an "off-axis" design features an L-shaped support that is rotateably mounted to either an attachment or the magnetically coupled arm. A wire extends from the L-shaped support to the magnetically coupled arm, such that turning the arm about its axis causes the L-shaped support to raise or lower. The compression clamp on this embodiment features two wings extending from the back part of the clamp, whereby the wings are long enough such that their wingspan exceeds the diameter of the opening to the cell of interest. To load the source material into a cell, the clamp is directed into the cell until the wings strike the opening of the cell, thereby bending each side of the clamp until the source material is released into the cell.

In a still further embodiment of the invention that is a hybrid of those two embodiments described above, both the L-shaped support and a side of the compression clamp are connected to control wires. The control wire to the compression clamp extends back to the magnetically coupled arm and can be controlled as described above to release the source material into a cell. The wire extending to the L-shaped support may be connected to other control means within the MBE machine, such as a cart used to transport materials within the buffer chamber of the machine. Thus by moving the cart forward and backward, the operator may raise and lower the L-shaped support so that it may be aligned with a cell for source material reloading.

Finally, the source material reloading processes described above may incorporate either a one-port or two-port operation technique. The single-port method, using a buffer chamber in connection with the growth chamber, has already been described. In the two-port method, a buffer chamber or load-lock device is attached to the growth chamber. In the case where source material is being reloaded, that material is moved into the load lock, the load lock is brought to a vacuum, and then the load lock is opened such that a passageway exists between the growth chamber and load lock. The reload or other tool is located in a port roughly opposite the load lock. The tool may be attached to a magnetically coupled arm, or to a wobble stick that is attached to the port. Using the magnetically coupled arm or wobble stick, the tool is pushed into the load lock to retrieve the source material, and is then extended over to the cell for loading as explained above. Generally, the geometry of such a machine would have the port for the magnetically coupled arm or wobble stick on one side of the growth chamber, and the load lock and cell to be loaded on the other side of the growth chamber.

It is therefore an object of the invention to provide a tool and method for reloading and maintaining an apparatus without affecting the environment maintained within the apparatus, for example, having an ultra-high vacuum environment without venting the environment.

It is a further object of the invention to perform source material reloading in an MBE machine without translation of the cells being loaded.

It is a further object of the invention to provide a tool and method to reduce the down-time resulting from the reloading and maintenance of an MBE machine.

Further objects and advantages of the present invention will be apparent from a consideration of the following detailed description of the preferred embodiments in conjunction with the appended drawings as briefly described following.

BRIEF DESCRIPTION OF THE DRAWINGS

FIG. 1 is a plan view of an MBE machine for use with a preferred embodiment of the invention.

FIG. 2 is a perspective view of a source material reloading tool for easily melted material according to a preferred embodiment of the invention.

FIG. 3 is a partial cut-away view of a source material reloading tool for easily melted material in the load chamber of an MBE machine according to a preferred embodiment of the invention.

FIG. 4 is a partial cut-away view of a source material reloading tool for easily melted material extended into the growth chamber of an MBE machine for the purpose of reloading source material into an effusion cell according to a preferred embodiment of the invention.

FIG. 5 is a partial cut-away view of a source material reloading tool according to an "on axis" preferred embodiment of the invention.

FIG. 6 is a partial cut-away view of a source material reloading tool according to an "off axis" permanent compression preferred embodiment of the invention.

FIG. 7 is a partial cut-away view of a source material reloading tool according to an "off-axis" variable compression preferred embodiment of the invention.

FIG. 8 is a partial cut-away view of a source material reloading tool used in conjunction with a two-port growth chamber design according to a preferred embodiment of the invention.

DETAILED DESCRIPTION OF THE PREFERRED EMBODIMENTS

Referring now to FIG. 1, the general layout of an MBE machine will be described in which the present invention may be used. Growth chamber 10 is connected to load chamber 12 through load chamber air lock 18. Wafer holder 20 is connected to a side wall of growth chamber 10, while effusion cell 22 is connected to the back wall of growth chamber 10 (only one effusion cell 22 is shown for clarity). Cart 34 travels on track 36 to carry items through load chamber 12 and to the entry point of growth chamber 10. Alternatively, a transversely oriented magnetically coupled arm (not shown) could be used in place of cart 34 and track 36 as a means to transport materials within load chamber 12.

Referring now to FIG. 2, the preferred embodiment of source material reloading tool 38 for easily melted materials is shown. Reloading tool 38 has a tubular body 44 with a tapered, closed end. Hole 40 is fashioned into reloading tool 38 at the closed end. A stiff wire (not shown) may be attached to the open end of body 44 (opposite hole 40) to keep solid source materials inside body 44 from slipping out during the reloading operation. In the alternative, a trap door or any other fastening means may be used to ensure that the source material remains within body 44 during manipulation of tool 38. Reloading tool handle 46 extends from body 44 and features an attachment point at the end opposite body 44.

FIG. 3 shows reloading tool 38 mounted on magnetically coupled arm 50. Magnetically coupled arm 50 extends through side port 32 and thus reloading tool 38 is positioned within load chamber 12. Handle 46 of reloading tool 38 may be connected by any conventional means, but preferably is clamped in such a manner that reloading tool 38 may be removed from arm 50 without removing arm 50 from side port 32, thereby allowing a change of tools on arm 50 without venting load chamber 12. Tools that are not in use may be stored in load chamber 12 so that tools may be changed without venting of load chamber 12.

The process for reloading easily melted source material in an effusion cell 22 using reloading tool 38 may now be described with reference to FIGS. 1, 3, and 4. Although in this example the source material used is gallium, the invention is equally applicable to the reloading of other solid source materials. Load chamber air lock 18 is first closed. Next, load chamber 12 may be vented without losing the vacuum in growth chamber 10. End port 56 may then be opened. Cart 34 is moved along track 36 to the position nearest end port 56 within load chamber 12. A block of gallium is placed within cart 34, and end port 56 is closed. As noted above, the time required to restore load chamber 12 to the required vacuum and purity levels for MBE processes is far less than the time required to restore growth chamber 10 following venting. In practice, it is believed that the time required to restore the environment of load chamber 12 on most commercial MBE machines is about two days, compared to a time of about one month for the restoration of the environment within growth chamber 10 after venting.

Cart 34, which now contains the gallium source material block, may be pulled along track 36 until it reaches a position in load chamber 12 directly across from side port 32. Using wobble stick 48, the operator may remove the source material from cart 34 and place it in reloading tool 38 attached to arm 50. It should be noted that wobble stick 48 may a so be used to attach reloading tool 38 to arm 50 if it is not already attached, and may in addition be used to disengage any other tools from arm 50 in order to attach reloading tool 38. The result of.this process is that source material is held in body 44 of reloading tool 38 at the end of arm 50, within load chamber 12 and aligned with the passage between load chamber 12 and growth chamber 10. Provided that load chamber 12 has been restored to an ultra-high vacuum environment, load chamber air lock 18 may then be opened so that an open passage is created between load chamber 12 and growth chamber 10. Arm 50 may be used to move reloading tool 38 forward past load chamber air lock 18 and into growth chamber 10.

It has been found that a half turn is necessary to properly align reloading tool 38 into position with effusion cell 22, if effusion cell 22 is located on the lower half of the back wall of growth chamber 10. When reloading tool 38 is attached to arm 50, it is aligned such that it is turned slightly upward. This alignment is necessary so that body 44 of reloading tool 38 does not strike objects in load chamber 12, such as cart 34, as it travels past them. Once arm 50 has been pushed inward sufficiently such that body 44 of reloading tool 38 enters growth chamber 10, arm 50 is given a half turn such that body 44 of reloading tool 38 is now pointing downward. This downward orientation is necessary so that body 44 of reloading tool 38 clears wafer holder 20 and is properly aligned to enter effusion cell 22. The exact alignment of reloading tool 38 with respect to arm 50 will depend upon the configuration of the growth chamber 10 and effusion cell 22 of interest.

As arm 50 continues forward, reloading tool 38 will approach effusion cell 22 as shown in FIG. 4. Arm 50 is then manipulated such that body 44 of reloading tool 38 enters effusion cell 22, with hole 40 in body 44 stopping at a point such that it is positioned above the opening in the crucible (not shown) within effusion cell 22. The heater integrated into effusion cell 22 may then be activated to melt the gallium within body 44 of reloading tool 38, such that it flows through hole 40 and pours into effusion cell 22. Alternatively, an additional heat source may be attached to reloading tool 38 such that additional heat is supplied to the source material as needed; an additional heater is not needed for source materials such as gallium, since gallium has a relatively low melting point. Once the gallium has been drained from body 44 of reloading tool 38, reloading tool 38 is retracted from within growth chamber 10 in the opposite manner to which it was inserted using arm 50. Load chamber air lock 18 may then be closed, and the MBE process may continue provided that a wafer has been loaded in wafer holder 20 in a conventional manner.

FIG. 5 illustrates a preferred embodiment of the invention incorporating a reloading tool designed for use with materials that are not easily melted. Support 58, which preferably is formed into an "L" shape, is attached to the end of magnetically coupled arm 50. At the end of support 58 opposite arm 50 is compression claim 60. Compression clamp 60 is adapted to hold a block of solid source material firmly between its sides. Clamp wire 62 extends from one side of clamp 60, through a small hole in support 58, and is attached at its opposite end to magnetically coupled arm 50. In operation, this embodiment of the invention is directed toward cell 22 in a manner similar to that described above with respect to reloading tool 38. When clamp 60 is in place within cell 22, however, magnetically coupled arm 50 is rotated about its axis by the operator outside of the MBE machine. In this way, the resulting tension on clamp wire 62 causes clamp 60 to open, thereby releasing the solid source material into cell 22. Magnetically coupled arm 50 may then be retracted in a manner similar to that already described.

Another embodiment of the invention for use with materials that are not easily melted is shown in FIG. 6. In this embodiment, support 58 is hinged to support 58, and support wire 66 extends from one end of support 58 to magnetically coupled arm 50. Thus by turning arm 50 about its axis, clamp 60 attached to support 58 may be raised or lowered for alignment with cell 22 or for avoidance of objects within growth chamber 10 while maneuvering the source material into position. Once clamp 60 is within cell 22, wings 64 on clamp 60 will strike the outer edge of cell 22. It should be noted that wings 64 must be designed such that their wingspan is greater than the diameter of the opening leading into cell 22. As magnetically coupled arm 50 is brought forward further, the pressure exerted by the opening of cell 22 on wings 64 will cause clamp 60 to open, thereby releasing the sold source material into cell 22.

Yet another embodiment of the invention for use with materials that are not easily melted is shown in FIG. 7. This embodiment is a hybrid form of the invention shown in FIGS. 6 and 7. Magnetically coupled arm 50 is hinged to support 58. Support wire 62 is attached to support 58 and arm 50 such that when arm 50 is turned on its axis, clamp 60 attached to support 58 may be raised and lowered. Clamp wire 66 is attached at one end to support 58, and at its other end to a movable control within the MBE machine. In a preferred embodiment, this movable control may be cart 34. By moving cart 34 backward and forward, clamp 60 may be opened and closed. Thus when clamp 60 is in position with respect to cell 22, cart 34 may be moved such that tension is applied to wire 62, thereby opening clamp 60 and allowing the solid source material to fall into cell 22.

FIG. 8 illustrates a particular geometry of growth chamber 10 wherein the present invention may be practiced using two ports. In this embodiment, load lock chamber 68 extends from growth chamber 10 opposite port 32. Load lock 70 functions as an air lock that, when closed, separates growth chamber 10 from load lock chamber 68. In the case where source material is being reloaded using either reloading tool 38 or clamp 60 as described below, the material may be placed in load lock chamber 68 while load lock 70 is closed. Load lock chamber 68 may then be brought to a vacuum, and load lock 70 opened to form a passage to growth chamber 10. Reload tool 38 or clamp 60 and support 58 are attached to magnetically coupled arm 50 in port 32, which is roughly opposite to load lock 68 across growth chamber 10. In an alternative embodiment, wobble stick 48 may be used instead of magnetically coupled arm 50 to extend through port 32 for attachment of reloading tool 38 or support 58. Using magnetically coupled arm 50 or wobble stick 48, the appropriate tool is pushed into load lock chamber 68 to retrieve the source material. The tool is then extended over to cell 22 for loading as explained above. Generally, the geometry of such a machine would have port 32 on one side of growth chamber 10, and load lock chamber 68 and cell 22 on the other side of growth chamber 10.

The present invention has been described with reference to certain preferred and alternative embodiments that are intended to be exemplary only and not limiting to the full scope of the present invention as set forth in the appended claims.

We claim:

1. A device for reloading source materials in a maintained vacuum environment comprising a vacuum chamber and a effusion cell, said device comprising:
   (a) a tube adapted to hold a source material when the source material is in a solid state, and release the source material when the source material is in a liquid state, wherein said tube has a hole at one end through which source material in a liquid state may flow into the effusion cell; and
   (b) a transfer arm in communication with said container, wherein said transfer arm is operable from without said vacuum chamber to position said container to receive the source material in a solid state, transport the source material through the vacuum chamber, and deposit the source material into the effusion cell in a liquid state.

2. The device of claim 1, wherein said tube is open on the end opposite the end with said hole.

3. The device of claim 2, further comprising a gate across said open end.

4. The device of claim 1, further comprising a handle attached to said container and attachable to said transfer arm, wherein the longitudinal axis of said handle lies at an angle of between 5 and 90 degrees inclusive with the longitudinal axis of said container.

5. The device of claim 4, wherein said transfer arm is operable to rotate said container about the longitudinal axis of said handle.

6. The device of claim 5, wherein the vacuum chamber further comprises substrate platform, and wherein said transfer arm is operable to rotate said container downwardly to avoid contact between said container and the substrate platform as said container is moved through said vacuum chamber toward the effusion cell.

7. The device of claim 4, wherein the longitudinal axis of said container lies at an angle corresponding to an angle said effusion cell makes with the horizontal plane such that said container is adapted to fit at least partially within said effusion cell.

8. An apparatus for the creation of crystals by vapor-phase deposition using at least one source material, said apparatus comprising:
   (a) a vacuum chamber;
   (b) a effusion cell mounted to said vacuum chamber;
   (c) a transfer arm operable from without said vacuum chamber, and
   (d) a container in communication with said transfer arm, wherein said container is adapted to receive the source material when the source material is in a solid state and deposit the source material in the effusion cell when the source material is in a liquid state, wherein the longitudinal axis of said container lies at an angle of between 5 and 90 degrees inclusive to the longitudinal axis of said transfer arm.

9. The apparatus of claim 8, further comprising a substrate platform within said vacuum chamber, and wherein said transfer arm is operable to rotate said container to avoid contact between said container and the substrate platform as said container is moved through said vacuum chamber toward the effusion cell.

10. The apparatus of claim 8, further comprising a heater at said effusion cell, and wherein said container has an opening at one end through which source material in a liquid state may flow into the effusion cell.

11. The apparatus of claim 10, wherein the longitudinal axis of said container lies at an angle corresponding to an angle said effusion cell makes with the horizontal plane such that said container is adapted to fit at least partially within said effusion cell.

12. The apparatus of claim 8, wherein said container is one of a frustoconical, conical, and cylindrical shape.

13. The apparatus of claim 10, wherein said container is open on the end opposite the end with the opening.

14. The apparatus of claim 13, further comprising a gate across the open end of said container.

15. A device for the loading of source material in a effusion cell of a vapor-phase deposition machine, said device comprising a cup portion comprising a proximate end and a distal end, wherein said cup portion has a large opening at said proximate end, and said cup portion has a small opening at said distal end.

16. The device of claim 15, wherein the large opening at said proximate end is sized to receive a block of source material in the solid state, and wherein the small opening at said distal end is sized to prevent the passing of the block of source material in the solid state.

17. The device of claim 16, further comprising a handle portion attached to said proximate end.

18. The device of claim 17, wherein said handle portion is attached to said cup portion such that the longitudinal axis of said handle portion is at an angle to the longitudinal axis of said cup portion.

19. The device of claim 16, further comprising a gate attached to said proximate end, wherein said gate is operable to open to allow the loading of a block of source material in the solid state, and wherein said gate is operable to close to hold a block of source material in the solid state within said cup portion.

* * * * *